United States Patent [19]

Eerenstein et al.

[11] Patent Number: 5,636,229

[45] Date of Patent: Jun. 3, 1997

[54] METHOD FOR GENERATING TEST PATTERNS TO DETECT AN ELECTRIC SHORTCIRCUIT, A METHOD FOR TESTING ELECTRIC CIRCUITRY WHILE USING TEST PATTERNS SO GENERATED, AND A TESTER DEVICE FOR TESTING ELECTRIC CIRCUITRY WITH SUCH TEST PATTERNS

[75] Inventors: Lars A. R. Eerenstein; Mathias N. M. Muris, both of Eindhoven, Netherlands

[73] Assignee: U.S. Philips Corporation, New York, N.Y.

[21] Appl. No.: 977,935

[22] Filed: Nov. 18, 1992

[51] Int. Cl.$^6$ .................................................. G06F 11/00
[52] U.S. Cl. .................................................. 371/27
[58] Field of Search ........................ 371/27, 21.3, 25.1

[56] References Cited

U.S. PATENT DOCUMENTS 5,027,353  6/1991  Jarwala et al. ........................ 371/27
5,430,735  7/1995  Sauerwald et al. .................... 371/22.3

OTHER PUBLICATIONS

Wakerly, *Digital Design Principles and Practices*, Chpt. 1, pp. 33–36 1990.
McBean et al., "Bridging Fault Algorithms for a Boundary Scan Board," IEE Colloq. 1990, No. 183: Application and Development of the Boundary Scan pp. 1–8.
IEEE Standard 1149.1-1190 "Standard Test Access Port and Boundary Scan Architecture" 1990.

*Primary Examiner*—Emanuel T. Voeltz
*Assistant Examiner*—M. Kemper
*Attorney, Agent, or Firm*—Laurie E. Gathman

[57] ABSTRACT

A method for generating test patterns to detect an electric shortcircuit, a method for testing electric circuitry while using test patterns so generated, and a tester device for testing electric circuitry with such test patterns. If electric circuitry comprises a plurality of separate nets, a short circuit between an arbitrary pair of nets may be detected by driving the first net at logic zero and the second net at logic one. Measuring the two effective net potentials of the pair of nets will then reveal the short in that two equal potentials would occur. In the case of CMOS technology the driving patterns should also comprise the inverse of the combination above, and also for each pair of nets the number of non-identical overall patterns having the particular 1/0 and 0/1 combinations should be guaranteed and adjustable. The total number of patterns should be minimal. In a test pattern matrix, each column is a single overall pattern; each row is the sequence of signals for the net in question. Each pair of nets is then differentially driven at least twice, either in one, or in both polarities. The minimum Hamming distance between the various rows is equal to two. For the number of nets equal to N the minimum number of test patterns P obeys $$\log_2 (N+2) \leq P \leq \log_2 (N+2)+2$$

11 Claims, 2 Drawing Sheets

METHOD FOR GENERATING TEST PATTERNS TO DETECT AN ELECTRIC SHORTCIRCUIT, A METHOD FOR TESTING ELECTRIC CIRCUITRY WHILE USING TEST PATTERNS SO GENERATED, AND A TESTER DEVICE FOR TESTING ELECTRIC CIRCUITRY WITH SUCH TEST PATTERNS

FIELD OF THE INVENTION

The invention relates to a method for generating test patterns to detect a shortcircuit in an electric system. Although the circuit need not have a specific character, the embodiments hereinafter will relate to digital electronic circuitry on the level of a single integrated circuit chip or of a multi-chip board level. However, although the method itself is based on discrete theory that is well applicable in a digital electronic environment, it is likewise applicable for testing analog electronics, as well as for testing straight electrical circuitry, such as a bundle of cables. Now, if such circuitry comprises a plurality of separate nets, a shortcircuit between an arbitrary pair of nets may be detected by driving the first net at logic zero and the second net at logic one, or vice versa. In principle, any further net than the two so considered may then be driven at an arbitrary value. If a short exists between the first and the second net, the measured effective net potentials of the pair of nets will be the same, thereby revealing the short. The net may be tested for complete galvanic isolation from another net, such as in the case of a wire in a bundle of wires. In on-chip electronics, the net may be an interconnecting trace between various buffer stages. In principle, whereas the conductive traces themselves are mutually insulated, they would relate to other shared circuitry, such as an input register or output register, linked to the nets.

The invention also relates to a method for testing electric circuitry while using test patterns generated according to the method. A particular useful method for testing digital electronic circuitry has been described in the IEEE Standard 1149.1-1190 "Standard Test Access Port and Boundary Scan Architecture", and in particular U.S. patent applications Ser. No. 07/90,489 now abandoned; Ser. No. 07/374,515 now abandoned; Ser. No. 07/420,612 which issued as U.S. Pat. No. 5,430,735, herein incorporated by reference. The reference allows for effectively testing electronic circuitry at the board level, package level and others, with a minimal number of test pins required, while still allowing complete, straightforward and flexible testing. The reference did not address the problem of minimizing the number of necessary test patterns for a particular number of nets. Yet of course, such minimizing is an essential factor for reducing test time and costs. The differences between testing short circuits in various environments are principally restricted to physical aspects, such as drive voltage levels of "0" and "1", net capcitance and associated maximum bit frequency, etcetera.

The invention also relates to a tester device for testing electric circuitry with test patterns generated according to the preceding.

SUMMARY OF THE INVENTION

Accordingly, it is, inter alia an object of the invention to realize a method for generating a minimum number of test patterns that has a guaranteed minimum performance level as expressed in the appropriate detection of inter-net shorts. According to one of its aspects, the invention provides a method for generating test patterns to detect an electric short between respective separate nets in electrical circuitry. The method comprising the steps of:

defining a bit string field wherein each of its plurality of bits is steadily assigned to a particular one of the nets;

selecting a bit-error detectable code having a predetermined word length and an associated minimum Hamming distance;

in the code selecting a number of different code words that is equal to the plurality and assigning each such code word to a particular respective one of the nets;

assembling respective different bits strings of equally positioned bits of the words for combined application of each such bit string to the circuitry.

The invention also relates to a method for testing electric circuitry using test patterns generated according to the above which would minimize required test time. The invention also relates to a tester for testing electric circuitry with the test patterns so generated. Commercial advantages of faster testing would be obvious.

Preferably, in the case of CMOS technology the driving patterns should also comprise the inverse of the combination above, and also for each pair of nets the number of non-identical overall patterns having the particular 1/0 and 0/1 combinations should be guaranteed and adjustable. Further advantageous aspects are recited in dependent Claims.

BRIEF DESCRIPTION OF THE DRAWING

Various aspects and advantages of the invention will be explained with respect to the exemplary preferred embodiments that are shown in the appended Figures as follows.

Table 1 shows the necessary test patterns for testing 11 separate nets.

DESCRIPTION OF A PREFERRED EMBODIMENT

The accompanying table 1 shows a solution for up to 11 nets. Each column is a single overall pattern (vector); each row is the sequence of signals for the net in question. Each pair of nets is differentially driven at least twice, either in one, or in both polarities. It proves that the minimum Hamming distance between the various rows is equal to two. For the number of nets equal to N the minimum number of test patterns P obeys $$\log_2 (N+2) \leq P \leq \log_2 (N+2)+2$$

The set of rows can be visualized as adding each time a binary quantity 00011 to get the next row. Starting from other initial rows gives other sets of patterns of the same performance.

The code so generated is non-linear, because the sum of two code words does not necessarily form a new code word. Of course, there are other ways of finding necessary code words, such as by table look-up. The field of the code word may be another finite field of five bit size. The advantage of the code is that it is parametrizable, in that exactly the same generation method of the code works for any code word length. The only requirement for a tester device is to know how many nets can be served with a particular codeword length. Moreover, it has been found that the number of test patterns necessary for a complete test is minimal. In principle, a code with a greater minimum Hamming distance is applicable, but the generation of the code words would be more complicated. An advantage of a larger distance were that the number of test patterns applied were also larger (for the same number of nets), which could also lead to a higher detection probability of short circuits. Of course, instead of generating the code words along with upcoming needs, the tester device may have a ready-for-use set of test patterns in an appropriate store.

Figure 1:
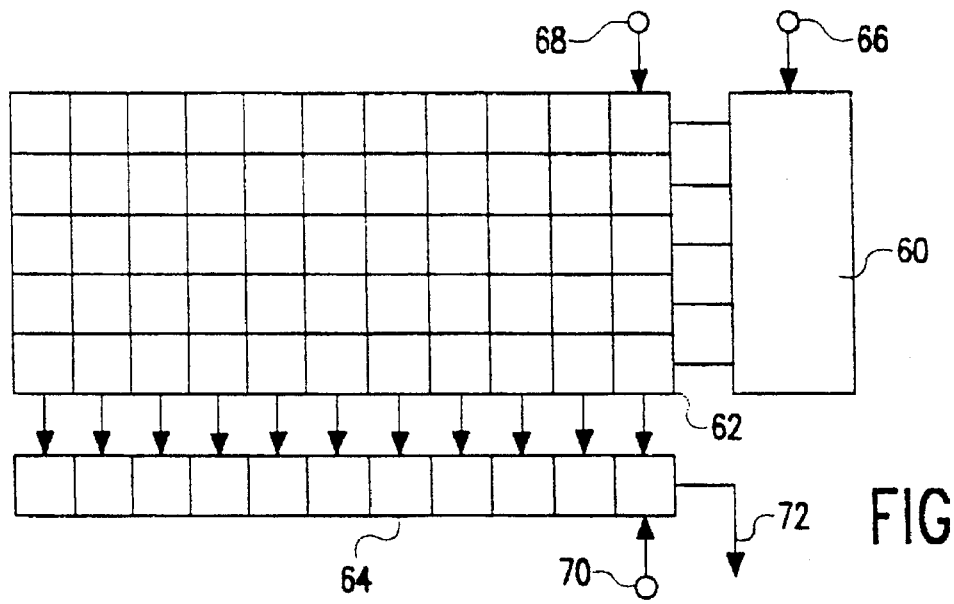
FIG. 1 shows generating a set of test patterns.

FIG. 1 shows generating a set of test patterns according to Table 1. Block 60 is the pattern generator proper; it has activation input means 66 that can be used for inputting the seed pattern of 5 bits and for by successive control pulses activate the successive additions of the pattern 00011 as described. If the required Hamming distance is different, another generation method is used; herein, the 5 bit output width of the generator is only by way of example. By itself, other ways of generating code words of a code that is defined by its Hamming distance are a common feature in the art of error correcting codes and need not be extensively discussed. Block 62 is the codeword memory, which in this elementary example has a storage capacity of 11 columns of 5 bits each, to cope with the storage requirements of Table 1. Activation input means 68 may comprise read/write control means, overall reset, and address incrementation. The writing is activated in synchronism with the generation of the patterns by generator 60 on successive row addresses. The reading upon reception of further activation signals is effected on successive column addresses. For simplicity, the double addressibility of memory 62 has not been detailed; it would be clear that the input signal on terminal(s) 68 has a more complex character than a single bit. Upon read-out from memory 62 an 11 bit test pattern is stored into parallel-in-serial-out-register 64. For controlling the load and shift operations, this register has activation input 70, that may be multiple as required. Upon receiving shift control pulses, the serial test pattern appears on output 72. Now, modifications of the device of FIG. 1 would be near at hand for the skilled art practitioner: first, the dimensions of the apparatus may be as required. Next, if the device under test needs less than the maximum storage capability, the superfluous part can be simply ignored, either as regards the test pattern generation in device 60, or as regards the usage of stored and/or output patterns of memory 62. Further, the principle of test pattern generation in device 60 may be as regarded useful.

Figure 2:
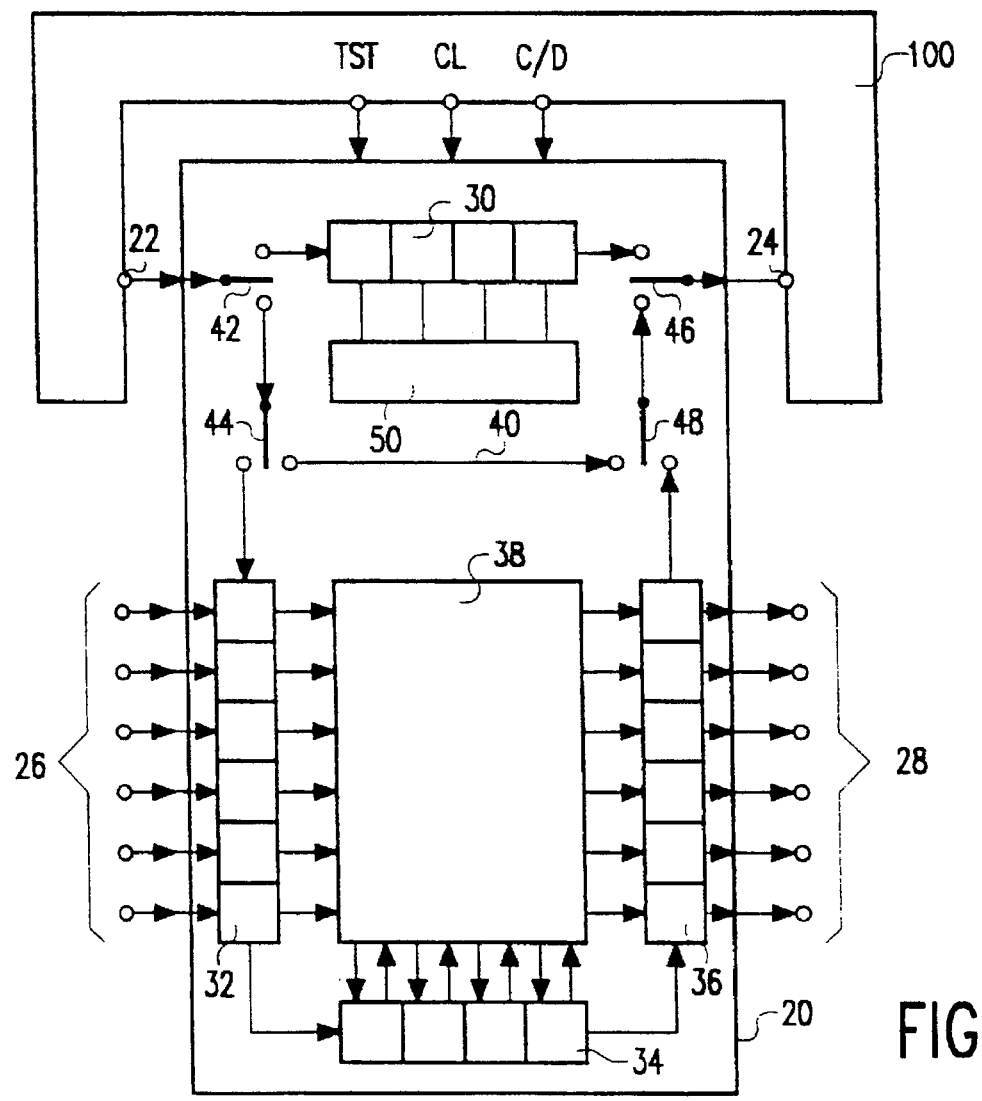
FIG. 2 shows an elementary example of testing electronic circuitry by means of the Boundary Test Standard.

FIG. 2 shows an elementary example of testing electronic circuitry by means of the Boundary Test Standard. For simplicity, only a single integrated circuit package 20 and its provisions have been shown. The intended functionality of the circuit is located within block 38, but this has not been detailed further as it is not directly related to the present invention. This functionality further needs input pins 26 and output pins 28. Each input pin and each output pin is mapped on a register stage of registers 32, 36, respectively. Registers 32, 34, 36 have been serialized to a single register chain for transiently storing test patterns for application to functionality 38 and result patterns derived from functionality 38. For controlling the boundary scan test proper, the Figure shows Serial Data In 22, Serial Data Out 24, Test Control pin TST, Test Clock pin CL, Control/Data selection pin C/D, Control Input Register 30, and Control Decoder 50. For various routing purposes, there are furthermore demultiplexer switches 42, 44 and multiplexer switches 48, 46. Finally, there is a bypass 40 that has a single flipflop not shown. The test sequence is as follows: first control register 30 is serially filled with switch 42 in the appropriate position. Decoding of the control word now controls positions of the various switches for serially loading the test pattern. After a brief execution of the test, usually through only a single clock pulse period, the result pattern is present in the register chain for subsequent serial outputting and evaluation. In the standard, pins TST and C/D have been combined to a single pin for loading a test activation bit sequence that drives an on-chip test controller TAP-generally a finite state machine-for governing the successive elementary test operations. The test clock also controls the bypass flipflop. Various refinements of the above general procedure have been published. As shown, the device under test interfaces to tester device 100 that by itself would encompass the arrangement of FIG. 1 or another provision to produce the test patterns. The evaluation within tester device 100 of the result patterns received can be in various ways: bit by bit comparison with a proven device of the same structure; arithmetic analysis; signature generation, and other.

Now, the respective mutually isolated nets supra, may either be on a single chip substrate, and the serial output from FIG. 1 could then feed the serial test data in of FIG. 2. In case the nets relate to various different chips and or on-substrate wiring, the output from register 64 in FIG. 1 may be in parallel or be mixed serial-parallel as required. In such case, the control may be in the same line as described with respect to FIG. 1: first load the control pattern, next load the test pattern, finally unload the result pattern, all under control of mode control signals and routing signals.

TABLE 1

| Tables: | | | | | |
|---|---|---|---|---|---|
| A | 0 | 0 | 0 | 0 | 1 |
| B | 0 | 0 | 1 | 0 | 0 |
| C | 0 | 0 | 1 | 1 | 1 |
| D | 0 | 1 | 0 | 1 | 0 |
| E | 0 | 1 | 1 | 0 | 1 |
| F | 1 | 0 | 0 | 0 | 0 |
| G | 1 | 0 | 0 | 1 | 1 |
| H | 1 | 0 | 1 | 1 | 0 |
| I | 1 | 1 | 0 | 0 | 1 |
| J | 1 | 1 | 1 | 0 | 0 |
| K | 1 | 1 | 1 | 1 | 1 |

Figure 3:
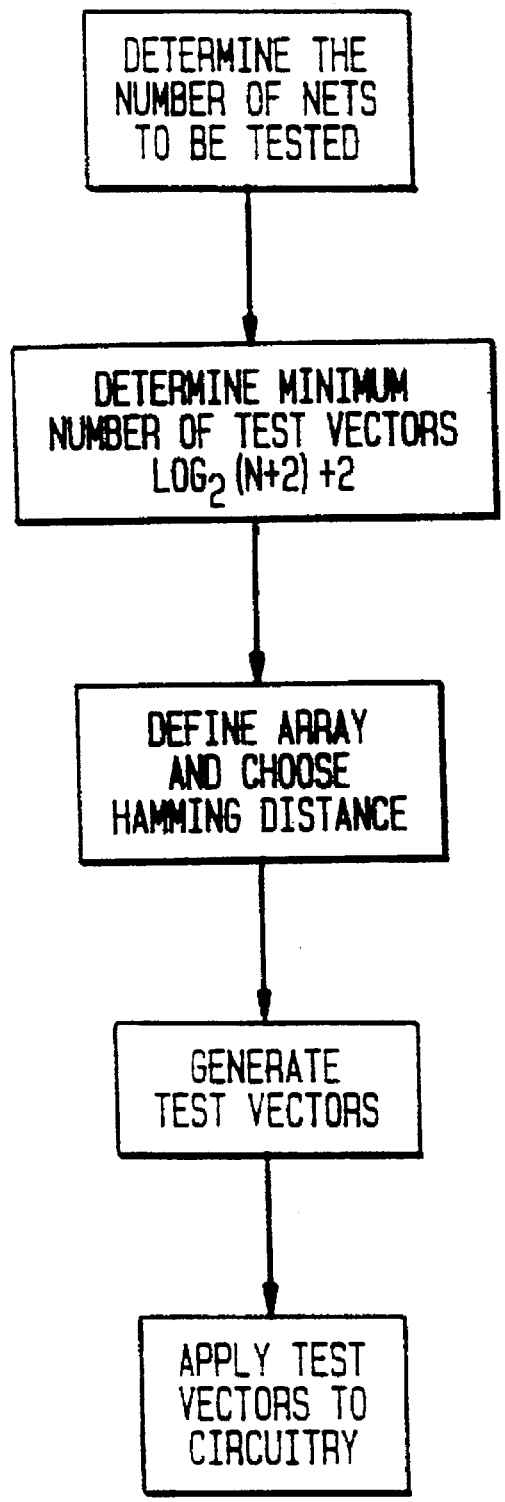
FIG. 3 shows a flow chart of a preferred embodiment of the invention.

FIG. 3, shows a flow chart describing the method of the present invention.

We claim:

1. A method for generating test vectors to detect electric shorts between respective separate nets in electrical circuitry such that a minimum number of test vectors is required, said method comprising the steps of:

determining the number of N nets to be tested;

defining a two-dimensional array of bits having P rows and N columns, wherein (i) N is the number of nets to be tested, (ii) a single row forms a test vector, (iii) P is the number of test vectors wherein each test vector includes N bits which are applied simultaneously to the different nets, and (iv) a single column forms a test sequence and includes P bits to be applied successively to a particular net;

choosing a predetermined minimum Hamming distance between the test sequences of respective nets;

determining the minimum number of test vectors to detect the electric shorts between the nets in the electrical circuitry;

generating the test sequences in accordance with the predetermined minimum Hamming distance and the minimum number of test vectors; and applying the test vectors to the electrical circuitry.

2. A method as claimed in claim 1, wherein said minimum Hamming distance is equal to 2.

3. A method as claimed in claim 2, wherein said test sequences constitute an arithmetic series with an incremental value of binary . . . 011=decimal 3 from one test sequence to a next particular test sequence.

4. A method as claimed in claim 1, wherein said test sequences are non-linear.

5. A method as claimed in claim 1 wherein for a number of N nets the dimension P is at most equal to $\log_2(N+2)+2$.

6. A method for testing electric circuitry to detect electric shorts between respective separate nets therein such that a minimum number of test vectors is required, said method comprising the steps of:

determining the number N of nets to be tested;

defining a two-dimensional array of bits having P rows and N columns, wherein (i) N is the number of nets to be tested, (ii) a single row forms a test vector, (iii) P is the number of test vectors wherein each test vector includes N bits which are applied simultaneously to the different nets, and (iv) a single column forms a test sequence and includes P bits to be applied successively to a particular net;

choosing a predetermined minimum Hamming distance between the test sequences of respective nets;

determining the minimum number of test vectors required to detect the electric shorts between the nets in the electrical circuitry;

generating the test sequences in accordance with the predetermined minimum Hamming distance and the minimum number of test vectors; and applying the test vectors to the electrical circuitry.

7. The method according to claim 6, further including the step of: for each application of all of the P test vectors, measuring the output of the electric circuitry to determine whether a short exists between two nets.

8. The method in accordance with claim 6, wherein the step of determining determines the minimum number of test vectors to be $\log_2(N+2)+2$.

9. A tester device for testing electric circuitry with test vectors to detect electric shorts between respective separate nets in the electrical circuitry such that a minimum number of test vectors is required, said device comprising:

array means for defining a two-dimensional array of bits having P rows and N columns, wherein (i) N is the number of nets to be tested, (ii) a single column of the N columns forms a test sequence and includes P bits which P bits are to be applied successively to a particular net, (iii) P is the number of test vectors, and (iv) a single row of the P rows forms a test vector and includes N bits which N bits are to be applied simultaneously to the different nets;

means for generating the N columns in accordance with (a) a predetermined Hamming distance and (b) the minimum number of test vectors required to find the electric shorts between the nets of the electric circuitry; and means for applying the test vectors to the electrical circuitry.

10. The tester device in accordance with claim 9, wherein the minimum number of test vectors is $\log_2(N+2)+2$.

11. A method for generating test vectors to detect electric shorts between respective separate nets in electric circuitry such that a minimum number of test vectors is required, said method comprising the steps of:

determining the number N of nets to be tested;

choosing a bit error detectable code having a word length of P, whereby P is at most equal to $P=\log_2(N+2)+2$, and an associated minimum Hamming distance;

defining a two-dimensional array of bits having P rows and N columns, wherein (i) N is the number of nets to be tested, (ii) a single row forms a test vector, (iii) P is the number of test vectors wherein each test vector includes N bits which are applied simultaneously to the different nets, and (iv) a single column forms a test sequence and includes P bits to be applied successively to a particular net;

selecting N code words in said code to fill said array; and applying the test vectors to the electric circuitry.

* * * * *